US012735616B2

(12) United States Patent
Lescoffit et al.

(10) Patent No.: US 12,735,616 B2
(45) Date of Patent: Sep. 15, 2026

(54) USE OF A MONOESTER AND A DIESTER AS A DIELECTRIC COOLANT

(71) Applicant: OLEON NV, Evergem (BE)

(72) Inventors: Anne-Elise Lescoffit, Margny-les-Compiegne (FR); Marion Kerbrat, Margny-les-Compiegne (FR)

(73) Assignee: Oleon NV, Evergem (BE)

( * ) Notice: Subject to any disclaimer, the term of this patent is extended or adjusted under 35 U.S.C. 154(b) by 0 days.

(21) Appl. No.: 18/728,785

(22) PCT Filed: Nov. 3, 2023

(86) PCT No.: PCT/EP2023/080647
§ 371 (c)(1),
(2) Date: Jul. 12, 2024

(87) PCT Pub. No.: WO2024/094840
PCT Pub. Date: May 10, 2024

(65) Prior Publication Data

US 2025/0002770 A1 Jan. 2, 2025

(30) Foreign Application Priority Data

Nov. 4, 2022 (EP) .................................... 22306674

(51) Int. Cl.
*C09K 5/10* (2006.01)
*H05K 7/20* (2006.01)

(52) U.S. Cl.
CPC ............ *C09K 5/10* (2013.01); *H05K 7/20236* (2013.01)

(58) Field of Classification Search
CPC .. C09K 5/10; H01B 3/20; H01B 3/22; H01M 10/61; H01M 10/613
See application file for complete search history.

(56) References Cited

U.S. PATENT DOCUMENTS 4,889,650 A * 12/1989 Yoshimura ........... C10M 105/34 560/182
7,919,017 B2 * 4/2011 Bates ....................... C09K 5/10 252/570
8,188,018 B2 * 5/2012 Hashida ............... C10M 169/04 508/214
9,978,477 B2 * 5/2018 Martin ..................... H01B 3/20
2012/0164506 A1 * 6/2012 Claeys ..................... C09K 5/10 252/67
2020/0199430 A1 * 6/2020 Dance ...................... C09K 5/10
2022/0131205 A1 * 4/2022 Champagne ............. C09K 5/10

FOREIGN PATENT DOCUMENTS

EP 3161834 B1 6/2019
JP 2010-244979 A 10/2010
JP 2022048706 A 3/2022
WO 98/21293 A1 5/1998
WO WO-0119941 A1 * 3/2001 ................ C10L 1/18
WO WO-2006074553 A1 * 7/2006 ............... C09K 5/10
WO WO-2020182718 A1 * 9/2020 ............... C09K 5/10
WO 2020176171 A1 11/2020
WO 2020/252235 A1 12/2020
WO 2022129334 A1 6/2022

OTHER PUBLICATIONS

International Search Report and Written Opinion dated Jan. 25, 2024 from PCT Application No. PCT/EP2023/080647.
Raof et al., "Development of Palm-based Neopentyl Glycol Diester as Dielectric Fluid and its Thermal Aging Performance," IEEE Transactions on Dielectrics and Electrical Insulation, vol. 23, No. 4, (Abstract) Aug. 2016. p. 2051-2058.
Xu et al., "Synthesis, properties and thermokinetics of a kind of diesters as phase change materials," Solar Energy, 235 (2022), p. 180.

* cited by examiner

*Primary Examiner* — Matthew R Diaz
(74) *Attorney, Agent, or Firm* — ArentFox Schiff LLP

(57) ABSTRACT

The present invention relates to the use of a combination consisting essentially of a monoalcohol fatty acid ester and a diester, as a liquid dielectric coolant.

13 Claims, No Drawings

USE OF A MONOESTER AND A DIESTER AS A DIELECTRIC COOLANT

CROSS-REFERENCE TO RELATED APPLICATIONS

The present application is a national stage application filed under 35 U.S.C. 371 based on International Patent Application No. PCT/EP2023/080647, filed on Nov. 3, 2023, which claims priority to EP patent application Ser. No. 22/306,674.7, filed on Nov. 4, 2022, which are incorporated herein by reference in their entireties.

The present invention relates to the use of a composition comprising a combination consisting of a monoester and a diester, as a liquid dielectric coolant.

A liquid dielectric coolant is an electrically non-conductive liquid that is used to reduce the temperature and insulate an electrical device. This type of coolant is suitable for the direct immersion cooling of electrical devices. In this method, the electrical device is in direct contact with the liquid dielectric coolant.

Immersion cooling method is an efficient method to reduce the temperature as the thermal conductivity of a liquid is higher than the one of air, which is the traditional cooling method.

Different compounds exist, among them some esters have been described.

WO2020252235 discloses the use of dielectric oleaginous heat transfer fluid to cool electrical componentry. The dielectric oleaginous heat transfer fluid may be some isoparaffins, ester oils or ether oils. Esters suitable for use as dielectric oleaginous heat transfer fluids include among others, esters of monocarboxylic acids with monohydric alcohols; di-esters of diols with mono-carboxylic acids and di-esters of dicarboxylic acids with monohydric alcohols; polyol esters of monocarboxylic acids and polyesters of monohydric alcohols with polycarboxylic acids; and mixtures thereof.

WO2020182718 discloses the use of at least one ester, for cooling a drive system of an electric or hybrid vehicle. The ester according to the invention is advantageously a monoester, diester or triester. Preferably, it is a monoester or a diester. The monoester is preferably obtained from a carboxylic acid comprising at least a hydrocarbon chain of 3 to 14 carbon atoms. The diester formed between a dicarboxylic acid having a linear, saturated or unsaturated hydrocarbon chain, preferably of 3 to 14 carbon atoms, and a monohydric alcohol having a linear or branched, saturated or unsaturated hydrocarbon chain, preferably of 2 to 14 carbon atoms, interrupted by at least one heteroatom, preferably by an oxygen atom.

However, there is still a need for a liquid dielectric coolant having improved material compatibility property.

Indeed, the liquid dielectric coolant being in direct contact with the material(s) constituting the electrical device and possibly other material(s) within the cooling system, the liquid dielectric coolant needs to exhibit a good compatibility with the material(s) present on, in and/or around the electrical device.

By "material compatibility of a dielectric coolant", it is intended to mean that after immersion of the material in the dielectric coolant for 168 hours at 80° C., the material presents no more than 20%, preferably no more than 15%, more preferably no more than 10% change in volume, preferably according to the method described in Example 2.

By "immersion of the material in the dielectric coolant", it is intended to mean that the entire material is surrounded by the dielectric coolant.

This change in volume indicates possible swelling or shrinkage of the material and thus chemical interaction between the material and the dielectric coolant.

With the development of new high performance batteries and power electronics, the heat that needs to be controlled, requires more efficient cooling system, such as liquid dielectric coolants with compatibility with materials constituting those batteries and power electronics.

Therefore, there is still a need for a new liquid dielectric coolant to manage the temperature of electrical devices, in particular in the fields of electric vehicles and informatics equipment such as servers, that would present one or more, and preferably all of the following characteristics:

- a dielectric breakdown of at least 30 kV, measured according to the standard ASTM D877;
- an electrical resistivity of at least 200 MΩ·m at 20° C., measured according to the standard ASTM 1169;
- a thermal conductivity of at least 0.1300 W/(m·° C.) at 20° C., measured according to the standard ASTM 7896;
- a kinematic viscosity lower than 10 $mm^2/s$ at 40° C., measured according to the standard ASTM D445;
- a kinematic viscosity lower than 3 $mm^2/s$ at 100° C., measured according to the standard ASTM D445;
- a density of at most 950 $kg/m^3$ at 20° C., measured according to the standard ASTM 7042;
- a flash point of at least 130° C., measured according to the standard ASTM D92;
- a low pour point of at most −30° C., measured according to the standard ASTM D97;
- an oxidation stability of at least 600 min, measured according to the standard ASTM D 2272;

together with:

- a good material compatibility.

The inventors surprisingly found that specific combinations of monoester and diester could not only present one or more of those above mentioned characteristics, but also exhibit good compatibility with materials.

Accordingly, the present invention relates to the use of a combination consisting essentially of a monoalcohol fatty acid ester and a diester, as a liquid dielectric coolant; wherein the weight ratio monoalcohol fatty acid ester/diester is comprised between 15/85 and 55/45.

It is considered in the present patent application that the term "consisting essentially of" includes, inter alia, impuritie(s) of the compounds considered. The presence of impuritie(s) is indicated by a purity of the compound of interest of less than 100%.

In the present application, unless otherwise indicated, all ranges of values used are to be understood as being inclusive limits.

The combination consisting essentially of a monoalcohol fatty acid ester and a diester, wherein the weight ratio monoalcohol fatty acid ester/diester is comprised between 15/85 and 55/45, exhibits low electrical conductivity, good thermal conductivity, low viscosity, making it suitable to be used as dielectric coolant. In particular, the combination presents all the characteristics previously listed.

Moreover, the combination has the advantage of also having a good material compatibility property.

Preferably, the material is selected from the group consisting of copper; seals; coatings such as epoxy; polymers, in particular thermoplastic polymers such as polyvinyl chloride (PVC), polycarbonate (PC) and polylactic acid (PLA), or thermosetting polymers such as polyurethane and polyimide.

More preferably, the material is selected from the group consisting of polymers, even more preferably from the group consisting of thermoplastic polymers. In particular, the material is PVC, PLA and/or PC.

The monoalcohol fatty acid ester is a monoester obtainable from esterification of a monoalcohol with a fatty acid.

A monoalcohol is an hydrocarbon chain comprising only one hydroxyl function.

Preferably, the monoalcohol comprises between 4 and 18 carbon atoms, more preferably between 5 and 8 carbon atoms.

The diester is obtainable from esterification of a diol with fatty acids or from esterification of monoalcohols with a dicarboxylic acid.

A diol is an hydrocarbon chain comprising two hydroxyl functions.

Preferably, the diol comprises between 3 and 18 carbon atoms, more preferably between 3 and 8 carbon atoms.

Preferably, the dicarboxylic acid comprises between 4 and 12 carbon atoms, more preferably between 6 and 10 carbon atoms.

Preferably, the fatty acid of the monoalcohol fatty acid ester and of the diester comprises, each and independently, between 6 and 22 carbon atoms, more preferably between 8 and 18 carbon atoms.

Preferably, the fatty acids of the monoalcohol fatty acid ester and of the diester are different.

In particular, the fatty acid of the monoalcohol fatty acid ester comprises between 12 and 18 carbon atoms.

In particular, the fatty acid of the diester comprises between 8 and 10 carbon atoms.

Preferably, the diester comprises between 16 and 28 carbon atoms, more preferably between 19 and 26 carbon atoms.

Preferably, the monoalcohol fatty acid ester comprises between 16 and 26 carbon atoms, more preferably between 17 and 23 carbon atoms.

Advantageously, in the use according to the invention:

the monoalcohol fatty acid ester is obtainable from esterification of a monoalcohol comprising between 5 and 8 carbon atoms, with a fatty acid comprising between 12 and 18 carbon atoms;

the diester is obtainable from esterification of a diol with fatty acids, or from esterification of a monoalcohol with a dicarboxylic acid; the diester comprising between 19 and 26 carbon atoms.

Advantageously, in the use according to the invention:

the monoalcohol is chosen among the group consisting of isoamyl alcohol and 2-ethylhexyl alcohol; and the fatty acid is chosen among the group consisting of caprylic acid, capric acid, lauric acid, isostearic acid, and mixtures thereof.

Advantageously, in the use according to the invention, the diol is propylene glycol.

Advantageously, in the use according to the invention the dicarboxylic acid is sebacic acid.

Advantageously, in the use according to the invention, the monoalcohol fatty acid ester is chosen among the group consisting of isoamyl isostearate, isoamyl laurate and 2-ethylhexyl laurate.

Advantageously, in the use according to the invention, the diester is chosen among the group consisting of propylene glycol di-caprate/caprylate and di-2-ethylhexyl sebacate.

Advantageously, in the use according to the invention, the combination consists essentially of:

isoamyl isostearate and propylene glycol di-caprate/caprylate;

isoamyl laurate and propylene glycol di-caprate/caprylate; or 2-ethylhexyl laurate and di-2-ethylhexyl sebacate.

Advantageously, in the use according to the invention, the weight ratio monoalcohol fatty acid ester I diester is comprised between 20/80 and 55/45.

Preferably, the weight ratio monoalcohol fatty acid ester I diester is comprised between 20/80 and 50/50.

The present invention also relates to a combination consisting essentially of a monoalcohol fatty acid ester and a diester, wherein the weight ratio monoalcohol fatty acid ester I diester is comprised between 15/85 and 55/45; and wherein the combination of monoalcohol fatty acid ester and diester is:

isoamyl isostearate and propylene glycol di-caprate/caprylate, isoamyl laurate and propylene glycol di-caprate/caprylate, or 2-ethylhexyl laurate and di-2-ethylhexyl sebacate.

Preferably, the weight ratio monoalcohol fatty acid ester I diester is comprised between 20/80 and 55/45, more preferably between 20/80 and 50/50.

The combinations according to the invention present particularly good compatibility with materials, in particular with PVC, PC and PLA, as shown in Example 2.

The invention also relates to a composition comprising a combination according to the invention, and an antioxidant and/or a metal deactivator.

Preferably, the quantity of the combination represents at least 75% by weight, more preferably at least 80% by weight based on the weight of the composition.

Preferably, the quantity of the antioxidant represents at least 0.05% by weight, more preferably at least 0.1% by weight based on the weight of the composition.

Preferably, the quantity of the antioxidant represents at most 1.5% by weight, more preferably at most 1% by weight based on the weight of the composition.

Preferably, the antioxidant is a phenolic antioxidant.

Preferably, the quantity of the metal deactivator represents at least 10 ppm, more preferably at least 20 ppm based on the weight of the composition.

Preferably, the quantity of the metal deactivator represents at most 500 ppm, more preferably at most 250 ppm based on the weight of the composition.

The composition may further comprise an additive used in the field of lubricants.

A person skilled in the art knows how to select the most suitable additive(s) depending on the application. By way of example, reference may be made to the following manuals: “Fuels and Lubricants Handbook: technology, properties performance and testing”, by George E. Totten, 2003 and “Handbook of lubrification and tribology, vol II: Theory and Design”, by Robert W. Bruce, 2012.

The additive(s) used in the field of lubricants is/are preferably selected from the group consisting of friction reducers; anti-wears; and thickening agents.

The total quantity of additive(s) is preferably of at most 25%, more preferably of at most 20% by weight based on the total weight of the composition.

By “total quantity of additive(s)” it is intended to mean the quantity of all additive(s), including the additive(s) used in the field of lubricants, the antioxidant and the metal deactivator, present in the composition.

The present invention also relates to an use of the composition according to the invention, as a liquid dielectric coolant.

The present invention concerns a method for cooling an electrical device, by bringing into contact the electrical device with a combination consisting essentially of a monoalcohol fatty acid ester and a diester, wherein the weight ratio monoalcohol fatty acid ester I diester is comprised between 15/85 and 55/45, or with a composition according to the invention.

The combination, the monoalcohol fatty acid ester and the diester are as described above, including preferential and advantageous features.

Preferably, the method for cooling the electrical device, is performed with respect of the material(s) in contact with the combination or with the composition according to the invention, e.g. with a limited change in volume of the material, in particular with a change in volume that does not exceed 20%, preferably 15%, more preferably 10%.

The material is as described above, including preferential and advantageous features.

Preferably, the electrical device is:

- a server;
- a battery, in particular a lithium-ion battery or lithium polymer battery;
- a drive system of an electric or hybrid vehicle, in particular, the power electronics, the electric motor, the transmission, and/or the battery.

The contact between the electrical device and the combination is preferably made by immersion, total or partial, or by spraying.

Advantageously, in the method according to the invention, the combination is a combination according to the invention.

The invention is further described in the following examples. It will be appreciated that the invention as claimed is not intended to be limited in any way by these examples.

EXAMPLE 1: PREPARATION OF COMBINATIONS ACCORDING TO THE INVENTION

1.1. Chemicals Used

Monoesters:

- isoamyl isostearate: was prepared by esterification of isostearic acid with an excess of isoamyl alcohol in the presence of an acid catalyst at 160° C. until the acid value was of at most 0.1. The excess of alcohol was distilled, the catalyst was neutralized and the product filtered over Dicalite 478.
- isoamyl laurate: Jolee 7750 from Oleon;
- 2-ethylhexyl laurate: Radia 7127 from Oleon;

Diesters:

- propylene glycol (MPG) di-caprate/caprylate: Radia 7208 from Oleon; o di-2-ethylhexyl sebacate: Radia 7543 from Oleon.

1.2. Method

A monoester and a diester were mixed together at 25° C. according to chemicals and quantities described in Table 1 below.

TABLE 1

Combinations of monoester and diester

| | Monoester | Diester |
|---|---|---|
| C1 | 20 wt % isoamyl isostearate | 80 wt % MPG di-caprate/caprylate |
| C2 | 25 wt % isoamyl isostearate | 75 wt % MPG di-caprate/caprylate |
| C3 | 25 wt % isoamyl laurate | 75 wt % MPG di-caprate/caprylate |
| C4 | 50 wt % isoamyl laurate | 50 wt % MPG di-caprate/caprylate |
| C5 | 30 wt % 2-ethylhexyl laurate | 70 wt % di-2-ethylhexyl sebacate |
| C6 | 50 wt % 2-ethylhexyl laurate | 50 wt % di-2-ethylhexyl sebacate |

1.3. Characteristics of the Combinations According to the Invention

For each combination, following characteristics were measured:

- the thermal conductivity, according to the standard ASTM 7896;
- the kinematic viscosity at 40° C. and at 100° C., according to the standard ASTM D445;
- the density at 20° C., according to the standard ASTM 7042.

Results are described in Table 2 bellow:

TABLE 2

Characteristics of mixtures of monoester and diester

| | Thermal conductivity at 20° C. (W/(m.° C.)) | Kinematic viscosity at 40° C. ($mm^2/s$) | Kinematic viscosity at 100° C. ($mm^2/s$) | Density at 20° C. ($kg/m^3$) |
|---|---|---|---|---|
| C1 | 0.1403 | 6.90 | 2.19 | 909.2 |
| C2 | 0.1429 | 6.99 | 2.22 | 912.1 |
| C3 | 0.1415 | 5.76 | 1.94 | 870.9 |
| C4 | 0.1381 | 5.08 | 1.79 | 868.7 |
| C5 | 0.1397 | 9.08 | 2.74 | 897.1 |
| C6 | 0.1392 | 7.74 | 2.42 | 889.0 |

All the combinations according to the invention present a thermal conductivity of at least 0.1300 W/(m·° C.), a kinematic viscosity lower than 10 $mm^2/s$ at 40° C., and lower than 3 $mm^2/s$ at 100° C., and a density lower than 950 $kg/m^3$ at 20° C.

EXAMPLE 2: MATERIAL COMPATIBILITY OF COMBINATIONS ACCORDING TO THE INVENTION

The material compatibility is evaluated by changes in volume after exposure of a material sample in a combination.

2.1 Materials

- Polyvinyl chloride (PVC): H03VVH2-F Black from Nexans;
- Polylactic acid (PLA): Luminy® L130 from the Total Corbion company;
- Polycarbonate (PC): Palsun clear Polycarbonate UVP lmm thick from Palram.

2.2 Method

A material, selected among three pieces of wire in PVC, ten granulates of PLA and three pieces of PC (Palsun clear Polycarbonate UVP 1 mm thick), was placed in a beaker and weighted in air (mass air tOh) and in water (mass water tOh).

The material was then immerged with a combination according to the invention and the breaker placed in oven at 80° C. for 168 hours.

Once the material was dried, it was weighted in air (mass air t168h) and in water (mass water t168h).

The percentage of volume change was then calculated with the following formula:

[(Volume $t168h$−Volume $t0h$)/ Volume $t0h$]×100 with Volume=mass / density;

the density being a constant and calculated as:

density=[(mass air $t168h$−mass water $t168h$)−(mass air $t0h$−mass water $t0h$)]/(mass air $t0h$−mass water $t0h$)

This method was done tree times and the average values of volume changes are given in Table 3 below.

2.3 Results

TABLE 3

Volume changes of materials in contact with a combination according to the invention

| | Volume change (%) |
|---|---|
| PVC in C1 | 0 |
| PVC in C2 | −6.0 |
| PVC in C3 | 7.6 |
| PVC in C4 | −7.6 |
| PLA in C5 | −2.2 |
| PLA in C6 | 0.2 |
| PC in C6 | 0.3 |

It can be observed that all volume changes are less than 10%, when PVC, PLA or PC are immerged in a combination according to the invention C1-C6.

EXAMPLE 3: COMPARATIVE EXAMPLES OF MATERIAL COMPATIBILITY OF SOME ESTERS

Compatibility of PVC was evaluated according to the method described in Example 2.2 in different monoester and diesters instead of a combination according to the invention:

isoamyl laurate: Jolee 7750 from Oleon;

di-2-ethylhexyl sebacate: Radia 7543 from Oleon;

2-ethyl hexyl adipate: obtained by esterification of 2-ethylhexanol with adipic acid;

neopentyl glycol (NPG) diheptanoate: obtained by esterification of neopentyl glycol with heptanoic acid.

Results are gathered in Table 4 below.

TABLE 4

Volume changes of PVC in contact with different esters

| | Volume change (%) |
|---|---|
| PVC in isoamyl laurate | −23.7 |
| PVC in di-2-ethylhexyl sebacate | 40.1 |
| PVC in di-2-ethyl hexyl adipate | 117.5 |
| PVC in NPG dipheptanoate | 88.5 |

It can be observed that the volume changes of PVC after immersion in the different mono and diesters used alone is greater than 20%.

The invention claimed is:

1. A liquid dielectric coolant comprising a combination consisting essentially of a monoalcohol fatty acid ester and a diester, wherein the weight ratio of monoalcohol fatty acid ester/diester is comprised between 15/85 and 55/45, and wherein the combination of monoalcohol fatty acid ester and diester is:

isoamyl isostearate and propylene glycol di-caprate/di-caprylate, isoamyl laurate and propylene glycol di-caprate/di-caprylate, or 2-ethylhexyl laurate and di-2-ethylhexyl sebacate.

2. The liquid dielectric coolant of claim 1, wherein the weight ratio of monoalcohol fatty acid ester/diester is between 20/80 and 50/50.

3. A combination consisting essentially of a monoalcohol fatty acid ester and a diester, wherein the weight ratio of monoalcohol fatty acid ester/diester is between 15/85 and 55/45; and wherein the combination of monoalcohol fatty acid ester and diester is:

isoamyl isostearate and propylene glycol di-caprate/di-caprylate, isoamyl laurate and propylene glycol di-caprate/di-caprylate, or 2-ethylhexyl laurate and di-2-ethylhexyl sebacate.

4. The combination of claim 3, wherein the weight ratio of monoalcohol fatty acid ester/diester is between 20/80 and 50/50.

5. A method for cooling an electrical device comprising bringing into contact the electrical device with the combination according to claim 3.

6. The method of claim 5, wherein the contact between the electrical device and the combination is by immersion or by spraying.

7. The method of claim 5, wherein the electrical device is a server, a battery, or a drive system of an electric or hybrid vehicle.

8. The method of claim 7, wherein the drive system comprises power electronics, an electric motor, a transmission, and/or a battery.

9. A composition comprising the combination of claim 3, and an antioxidant and/or a metal deactivator.

10. The composition of claim 9, wherein the composition is a liquid dielectric coolant.

11. The composition of claim 9, further comprising a friction reducer, anti-wear, or thickening agent.

12. The composition of claim 9, wherein the weight ratio of monoalcohol fatty acid ester/diester is between 20/80 and 50/50.

13. A method for cooling an electrical device, comprising bringing into contact the electrical device with a composition according to claim 9.

* * * * *